(12) United States Patent
Tihanyi

(10) Patent No.: US 6,686,626 B2
(45) Date of Patent: Feb. 3, 2004

(54) SOURCE-DOWN POWER TRANSISTOR

(75) Inventor: Jenoe Tihanyi, Kirchheim (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/017,635

(22) Filed: Nov. 21, 2001

(65) Prior Publication Data

US 2003/0042540 A1 Mar. 6, 2003

Related U.S. Application Data

(63) Continuation of application No. PCT/DE00/01459, filed on May 10, 2000.

(30) Foreign Application Priority Data

May 21, 1999 (DE) .......................................... 199 23 522

(51) Int. Cl.[7] .................. H01L 29/76; H01L 29/94; H01L 31/062; H01L 31/113; H01L 31/119
(52) U.S. Cl. .................. 257/331; 257/329; 257/330; 257/341; 257/342
(58) Field of Search ................. 257/329, 330, 257/331, 341, 342, 344

(56) References Cited

U.S. PATENT DOCUMENTS 5,719,425 A 2/1998 Akram et al. ............... 257/344
6,284,604 B1 * 9/2001 Tihanyi ....................... 257/331

FOREIGN PATENT DOCUMENTS

EP 0 833 386 A1 4/1998 ................. 257/331
JP 8-227998 * 9/1996 ................. 257/330

OTHER PUBLICATIONS

International Search Report for PCT/DE00/09459, issued by the European Patent Office on Jan. 17, 2001.

* cited by examiner

*Primary Examiner*—Steven Loke
(74) *Attorney, Agent, or Firm*—Laurence A. Greenberg; Werner H. Stemer; Ralph E. Locher

(57) ABSTRACT

The invention relates to a source-down power transistor, in which narrow trenches filled with insulated polysilicon are provided between a source pillar and a drain pillar. Inversion channels form on the side walls of the trenches when a positive drain voltage and a positive gate voltage are applied. A current that can be controlled with the gate voltage flows in the inversion channels.

7 Claims, 1 Drawing Sheet

SOURCE-DOWN POWER TRANSISTOR

CROSS-REFERENCE TO RELATED APPLICATION

This application is a continuation of copending International Application No. PCT/CE00/01459, filed May 10, 2000, which designated the United States.

BACKGROUND OF THE INVENTION

FIELD OF THE INVENTION

The present invention relates to a source-down power transistor having a semiconductor body with two mutually opposite surfaces in which the semiconductor body includes a semiconductor substrate of a first conduction type and at least one semiconductor layer of a second conduction type located on the substrate.

A practically realized power transistor whose source electrode is located on the "underside" of a semiconductor body, more specifically on the main surface of a semiconductor body that is opposite the main surface having a gate electrode and a drain electrode, has not been proposed heretofore. Such a MOS power transistor would nevertheless be greatly advantageous for many applications relating to cooling on a cooling lug at 0 V potential, such as, for example, in the bodywork connection in a motor vehicle. This is because, precisely in such a case, there would then be no need for electrical insulation with respect to the cooling lug. Such insulation would otherwise reduce the heat conduction.

SUMMARY OF THE INVENTION

It is accordingly an object of the invention to provide a source-down power transistor which is distinguished by a simple construction and which can be fabricated without any difficulty.

With the foregoing and other objects in view there is provided, in accordance with the invention, a source-down power transistor, that includes a semiconductor body having a first surface and a second surface located opposite the first surface. The semiconductor body includes a semiconductor substrate and at least one semiconductor layer located on the substrate. The substrate is of a first conduction type and the at least one semiconductor layer is of a second conduction type. The first surface is located opposite the substrate. The source-down power transistor includes a first highly-doped region of the first conduction type that is located between the first surface and the semiconductor substrate. The first region extends to the substrate. The first region together with the substrate forms a source zone. The source-down power transistor includes a second highly-doped region of the first conduction type located in the at least one semiconductor layer at a non-zero distance away from the first region. The second region forms a drain zone extending from the first surface to a non-zero distance away from the substrate. The source-down power also transistor includes a plurality of narrow trenches extending between the first region and the second region. Each one of the plurality of the trenches has a longitudinal dimension extending between the first region and the second region in a longitudinal direction. The plurality of the trenches are lined with an insulating layer and are filled with a conductive material forming a gate electrode. The source-down power transistor also includes a source electrode located on the second surface of the semiconductor body.

The source-down power transistor thus has a semiconductor substrate of the first conduction type, which is preferably n$^+$-doped. At least one p$^-$-conducting semiconductor layer, which may have a thickness of 5 μm, is provided on the n$^+$-conducting semiconductor substrate, for example, an n$^+$-conducting silicon wafer. A plurality of such p$^-$-conducting layers are preferably situated on the semiconductor substrate.

The p$^-$-conducting layers can be fabricated epitaxially and are deposited one after the other in such a way that they each reach the specified thickness of about 5 μm. In surface regions of these epitaxially deposited layers, an n$^+$-type doping is introduced by implantation at locations at which a source zone and a drain zone, respectively, are later intended to be situated. After the deposition of all of the p-conducting layers with subsequent implantation of n$^+$-type dopings, a high-temperature treatment is performed, with the result that the implanted n$^+$-type dopings diffuse into one another and finally form pillar-like n$^+$-conducting regions. One of these regions, which reaches as far as the n$^+$-conducting semiconductor substrate, constitutes a source zone, while the other region, which ends before reaching the semiconductor substrate, that is to say, for example, does not go beyond the bottommost epitaxial layer, forms a drain zone.

A multiplicity of narrow trenches are then etched in the region between the source zone and the drain zone, the longitudinal direction of which trenches runs parallel to the direction between source zone and drain zone. These trenches may have a width of about 0.1 μm to a few μm. These trenches have a depth corresponding approximately to the depth of the drain zone. The trenches are then coated, on their walls and at the bottom, with an insulating layer made of silicon dioxide, for example, and are filled with n$^+$-conducting polycrystalline silicon or with another suitable conductive material. In this way, controllable current channels are produced in the at least one epitaxial layer on the side walls of the trenches.

The drain zone is then connected over the whole area to a metallization plane, and the gate electrode and the p-conducting body region from the at least one p-conducting epitaxial layer are finally contact-connected once or a number of times.

When a positive drain voltage is applied to the drain zone via the drain electrode and a positive gate voltage is applied to the gate electrode, an inversion channel is formed on the side walls of the trenches, so that a current flows there. This current can readily be controlled by changing the gate voltage. In this case, the threshold voltage of the source-down power transistor, constructed in this way, depends on the doping concentration in the at least one p-conducting epitaxial layer.

The conduction types specified can, of course, also be reversed, so that the first conduction type is the p-conduction type and the semiconductor substrate is thus p$^+$-doped, for example. In this case, the epitaxial layers are n-conducting.

The drain zone can, if appropriate, also include a plurality of highly doped regions which thus form a plurality of sections. In this case, the doping of these individual sections can be set freely by the size of the mask opening during the implantation of the n$^+$-type dopings. Preferably, however, these plurality of highly doped regions have a higher doping concentration with increasing distance from the trenches. An LDD construction for higher dielectric strength is possible in this way (LDD=lightly doped drain).

When a plurality of sections are used for the drain zone, at least one of the respective pillar-like regions can be provided with a "metal core" or a very highly doped polysilicon core, which, although making the fabrication method relatively complicated, nevertheless considerably reduces the on resistance of the power transistor.

Other features which are considered as characteristic for the invention are set forth in the appended claims.

Although the invention is illustrated and described herein as embodied in a Source-down power transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
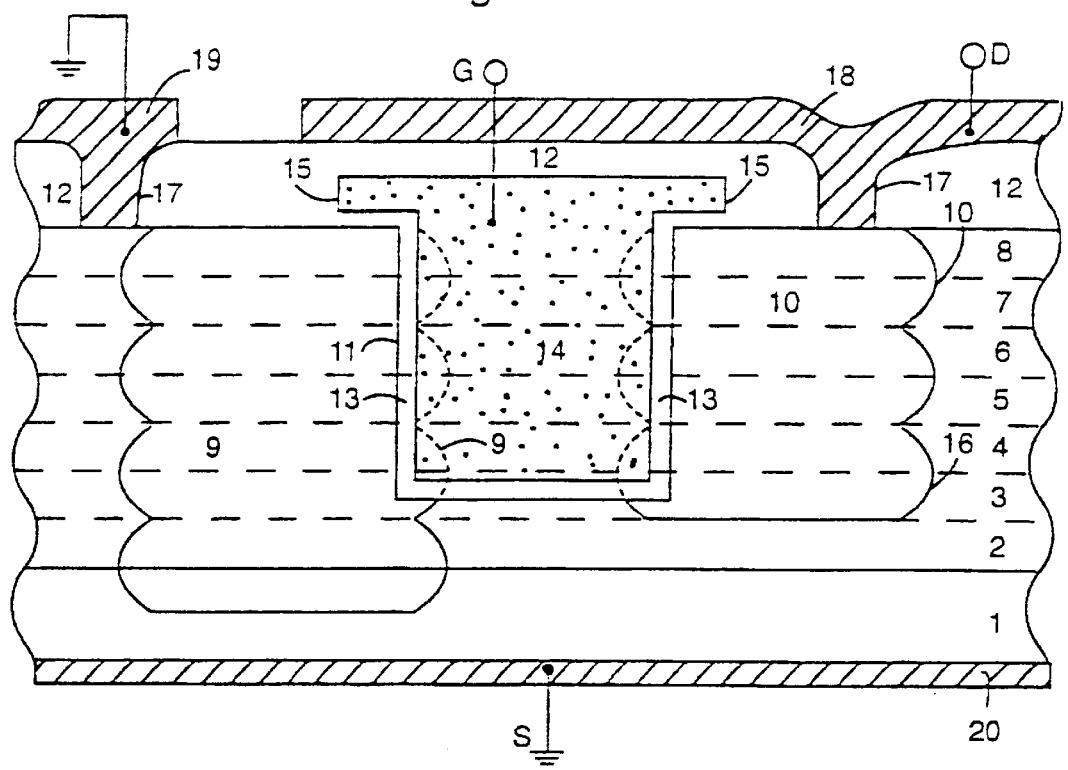
FIG. 1 shows a cross section of a source-down power transistor taken along the line A—A shown in FIG. 2.

Referring now to the figures of the drawing in detail and first, particularly, to FIG. 1 thereof, there is shown an $n^+$-doped silicon substrate 1, on which p-conducting epitaxial layers 2 to 8 are situated one above the other. These p-conducting epitaxial layers 2 to 8 are deposited one after the other. After each deposition of an epitaxial layer and prior to the deposition of the next epitaxial layer, $n^+$-type dopings are introduced, by implantation, into the surface of the already deposited epitaxial layer at the locations of later-formed pillar-like source and drain zones 9 and 10, respectively. After the deposition and implantation of all of the p-conducting layers 2 to 8 and all of the $n^+$-type dopings, the implanted $n^+$-type dopings are diffused over one another using a high-temperature treatment, thereby producing, as shown in FIG. 1, the pillar-like source zone 9 and the pillar-like drain zone 10. These zones 9 and 10 are $n^+$-doped in this case.

Figure 2:
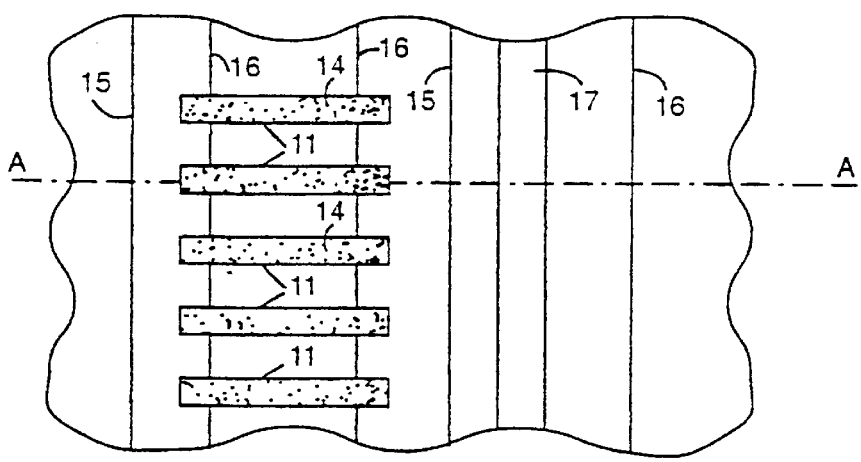
FIG. 2 shows a plan view of the source-down power transistor shown in FIG. 1.

Narrow trenches 11 (See FIG. 2) are then etched into the region between the zones 9, 10. These trenches are parallel to one another and essentially run in the direction between the source zone 9 and the drain zone 10. These trenches 11 penetrate through the epitaxial layers 4 to 8, for example, and thus have a depth of about 25 $\mu$m, if each of the individual epitaxial layers 2 to 8 has a layer thickness of about 5 $\mu$m. The trenches are then lined with an insulating layer 13 made, for example, of silicon dioxide and/or silicon nitride and are filled with $n^+$-doped polycrystalline silicon 14, which reaches as far as a "poly-edge" 15. In the regions between the trenches 11, the $n^+$-conducting source zone 9 and the $n^+$-conducting drain zone 10, respectively, extend as far as an "$n^+$-type edge" 16 (See FIG. 2).

After an insulating layer 12 made of silicon dioxide, for example, has been applied, contact holes 17 are introduced into the insulating layer 12 for a drain metallization layer 18 made of aluminum, and a body contact 19 that is likewise made of aluminum. In addition, a gate electrode G is connected to the polycrystalline silicon 14. Finally, a metal layer 20 made of aluminum, for example, is additionally applied to the semiconductor substrate 1, and serves as a source contact.

The trenches 11 with the polycrystalline silicon 14 are narrow and extend between the source zone 9 and the drain zone 10. Controllable inversion channels form on their side walls if a positive drain voltage $U_D$ is applied to the drain electrode D and a positive gate voltage is applied to the gate electrode G, so that a current flows. This current can be controlled by changing the gate voltage.

In this way, a source-down power transistor is obtained whose source electrode S is arranged on the "underside" and can be fitted there for example on a cooling lug at 0 V Potential. This source-down power transistor can be fabricated relatively simply using customary method steps, as has been explained above. All that is required for this purpose are various epitaxy steps with implantations and also the introduction of a plurality of trenches.

Figure 3:
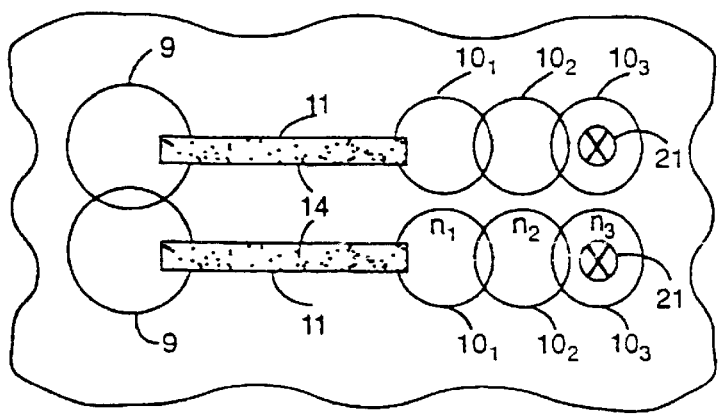
FIG. 3 shows a plan view of another exemplary embodiment of a source-down power transistor in which the drain zone includes a plurality of sections.

FIG. 3 shows a further exemplary embodiment of the invention, in which each trench 11 is assigned a source zone 9 and a plurality of drain zones $10_1$, $10_2$, $10_3$ with doping concentrations $n_1$, $n_2$ and $n_3$, respectively. In this case, $n_1<n_2<n_3=n^+$ holds true for the doping concentrations. In this way, it is possible to fabricate an "LDD" (Lightly Doped Drain) structure which is particularly suit able for relatively high voltages. It is advantageous in this case if a highly conductive "core" 21 made of metal or polycrystalline silicon is provided in the zone $10_3$. Such a "core" 21 enables the on resistance of the source-down power transistor to be reduced.

The magnitude of the respective dopings $n_1$, $n_2$ and $n_3$ in the zones $10_1$, $10_2$ and $10_3$ can be set freely by the size of the mask opening during the $n^+$-type dopings in the respective epitaxial layers.

In the exemplary embodiment shown in FIG. 3, the zones $10_1$, $10_2$ and $10_3$ each form sections of the drain zone 10. In other words, the pillar-like drain zone 10 is in this case fabricated from a plurality of sections.

I claim:

1. A source-down power transistor, comprising:

a semiconductor body having a first surface and a second surface located opposite said first surface, said semiconductor body including a semiconductor substrate and at least one semiconductor layer located on said substrate, said substrate being of a first conduction type and said at least one semiconductor layer being of a second conduction type, said first surface located opposite said substrate;

a first highly-doped region of said first conduction type located between said first surface and said semiconductor substrate, said first region extending to said substrate, said first region together with said substrate forming a source zone;

a second highly-doped region of said first conduction type located in said at least one semiconductor layer at a non-zero distance away from said first region, said second region forming a drain zone extending from said first surface to a non-zero distance away from said substrate;

a plurality of narrow trenches extending between said first region and said second region, each one of said plurality of said trenches having a longitudinal dimension extending between said first region and said second region in a longitudinal direction, and each one of said plurality of said trenches being lined with an insulating layer and being filled with a conductive material forming a gate electrode; and a source electrode located on said second surface of said semiconductor body.

2. The source-down power transistor according to claim 1, wherein said at least one semiconductor layer has a layer thickness of about 5 µm.

3. The source-down power transistor according to claim 2, comprising a plurality of second highly-doped regions lying one behind another in the longitudinal direction of each of said plurality of said trenches, said plurality of said second regions having a doping concentration that increases as a distance away from said plurality of said trenches increases.

4. The source-down power transistor according to claim 3, wherein at least one of said plurality of said second regions has a core region with conductive material.

5. The source-down power transistor according to claim 4, wherein said conductive material is polycrystalline silicon.

6. The source-down power transistor according to claim 1, comprising a plurality of second highly-doped regions lying one behind another in the longitudinal direction of each of said plurality of said trenches, said plurality of said second regions having a doping concentration that increases as a distance away from said plurality of said trenches increases.

7. The source-down power transistor according to claim 1, wherein said at least one semiconductor layer includes a plurality of semiconductor layers each having a layer thickness of about 5 µm.

* * * * *